US009111923B2

(12) United States Patent
Migita et al.

(10) Patent No.: US 9,111,923 B2
(45) Date of Patent: Aug. 18, 2015

(54) WIRING SUBSTRATE HAVING CONDUCTIVE BUMPS WITH RESIN SEALING BETWEEN BUMPS AND METHOD OF MAKING

(71) Applicant: OLYMPUS CORPORATION, Tokyo (JP)

(72) Inventors: Chihiro Migita, Tokyo (JP); Hiroshi Kikuchi, Hidaka (JP); Yoshiaki Takemoto, Tokyo (JP); Yoshitaka Tadaki, Hanno (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 13/835,891

(22) Filed: Mar. 15, 2013

(65) Prior Publication Data
US 2013/0256879 A1 Oct. 3, 2013

(30) Foreign Application Priority Data

Mar. 30, 2012 (JP) ................................. 2012-082931

(51) Int. Cl.
*H01L 21/44* (2006.01)
*H01L 23/498* (2006.01)
*H01L 21/28* (2006.01)
*H01L 21/48* (2006.01)

(52) U.S. Cl.
CPC .......... *H01L 23/49811* (2013.01); *H01L 21/28* (2013.01); *H01L 21/4853* (2013.01); *H01L 2924/0002* (2013.01)

(58) Field of Classification Search
None
See application file for complete search history.

(56) References Cited

U.S. PATENT DOCUMENTS

| 6,404,051 | B1 * | 6/2002 | Ezawa et al. .................. 257/734 |
| 6,900,079 | B2 * | 5/2005 | Kinsman et al. .............. 438/127 |
| 2003/0001283 | A1 * | 1/2003 | Kumamoto .................. 257/778 |
| 2003/0148593 | A1 * | 8/2003 | Okamoto et al. ............. 438/455 |
| 2005/0155791 | A1 * | 7/2005 | Saiki ............................. 174/262 |
| 2006/0046349 | A1 * | 3/2006 | Takeuchi ....................... 438/106 |
| 2006/0118953 | A1 * | 6/2006 | Farnworth et al. ........... 257/738 |
| 2008/0217792 | A1 * | 9/2008 | Onodera et al. .............. 257/778 |
| 2011/0076800 | A1 * | 3/2011 | Hirai et al. .................... 438/107 |
| 2012/0068355 | A1 * | 3/2012 | Aoki et al. .................... 257/774 |

FOREIGN PATENT DOCUMENTS

JP 2009-94545 A 4/2009

\* cited by examiner

*Primary Examiner* — Evan Pert
*Assistant Examiner* — Herve Assouman
(74) *Attorney, Agent, or Firm* — Westerman, Hattori, Daniels & Adrian, LLP

(57) ABSTRACT

A wiring substrate may include: a base having a predetermined thickness; a plurality of electrode portions formed to protrude on one surface in a thickness direction of the base; a wiring provided in the base and electrically connected to the electrode portions; and a resin layer formed on the base to fill between the plurality of electrode portions. An upper surface of the resin layer may be formed in a concave shape lower than a maximum height of the electrode portion, and an upper surface of the electrode portion and the upper surface of the resin layer form a continuous curved surface.

6 Claims, 4 Drawing Sheets

WIRING SUBSTRATE HAVING CONDUCTIVE BUMPS WITH RESIN SEALING BETWEEN BUMPS AND METHOD OF MAKING

BACKGROUND OF THE INVENTION

1. Field of the Invention

The present invention relates to a wiring substrate, and more specifically, to a wiring substrate including a number of electrodes formed to protrude on a base and a method of manufacturing the same, and a semiconductor device using the wiring substrate and a method of manufacturing the same.

Priority is claimed on Japanese Patent Application No. 2012-082931, filed Mar. 30, 2012, the content of which is incorporated herein by reference.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

A smaller high-performance semiconductor device has been required for a small highly-functional system, and a "silicon wafer direct bonding" scheme of bonding wafers having a number of minute bumps functioning as electrodes formed therein has been examined.

In silicon wafer direct bonding, sealing through injection of, for example, a resin around bumps between wafers for the purpose of protecting the bumps after the bumps are electrically connected has been performed. However, when bonding between the wafers having minute bumps formed at high density is performed, such resin sealing is difficult. That is, if a bump diameter becomes small, a height of the bump correspondingly decreases. As a result, the gap between the wafers is narrowed and resin flow becomes difficult. If resin injection is forcedly performed in such a state, there is a possibility of voids being locally generated as a result of the resin not partially flowing.

In Japanese Unexamined Patent Application, First Publication No. 2009-94545, a method of performing bonding, with a resin used at the time of formation of bumps left, has been proposed. That is, a photosensitive resin is prepared on a wafer, electrode formation portions are opened, and then bumps are formed. Then, surfaces of the bumps and a surface of the photosensitive resin are polished at one time to be the same smooth surface, and then bonding is performed.

In this method, it is unnecessary to inject the resin after the bonding, making it unnecessary to consider injection failure of the resin.

SUMMARY

A wiring substrate in accordance with a preferred embodiment of the present invention includes: a base having a predetermined thickness; a plurality of electrode portions formed to protrude on one surface in a thickness direction of the base; a wiring provided in the base and electrically connected to the electrode portions; and a resin layer formed on the base to fill between the plurality of electrode portions, and wherein an upper surface of the resin layer is formed in a concave shape lower than a maximum height of the electrode portion, and an upper surface of the electrode portion and the upper surface of the resin layer form a continuous curved surface.

The base may be formed of a semiconductor or an insulator.

The electrode portion may be formed of one of gold, copper, nickel and an alloy containing at least one of these metals.

The resin layer may be at substantially the same height as the maximum height when heated to a predetermined temperature and expanded.

A formation pitch of the electrode portion may be 10 micrometers or less.

A semiconductor device in accordance with a preferred embodiment of the present invention includes: a wiring substrate of the present invention; and a semiconductor element provided in the base.

A semiconductor device in accordance with a preferred embodiment of the present invention includes: a wiring substrate of the present invention; and a semiconductor chip or a semiconductor package provided in the base.

A method of manufacturing a wiring substrate in accordance with a preferred embodiment of the present invention is a method of manufacturing a wiring substrate including a base having a predetermined thickness, a plurality of electrode portions formed to protrude on one surface in a thickness direction of the base, and a wiring provided in the base and electrically connected to the electrode portions, the method comprising: forming the plurality of electrode portions in one surface of the base; forming a resin layer on the base to fill between the plurality of electrode portions; performing a planarization process on upper surfaces of the electrode portions and the resin layer to expose the upper surfaces of the electrode portions; and performing upper-surface processing on the upper surfaces of the electrode portions and the resin layer after the planarization process, so that the resin layer is more removed than the electrode portions.

The planarization process may be chemical mechanical polishing.

A method of manufacturing a wiring substrate in accordance with a preferred embodiment of the present invention is a method of manufacturing a semiconductor device formed by bonding at least two wiring substrates having electrode portions formed therein, wherein at least one of the wiring substrates is a wiring substrate including: a base having a predetermined thickness; a plurality of electrode portions formed to protrude on one surface in a thickness direction of the base; a wiring provided in the base and electrically connected to the electrode portions; and a resin layer formed on the base to fill between the plurality of electrode portions, and wherein an upper surface of the resin layer is formed in a concave shape lower than a maximum height of the electrode portion, and an upper surface of the electrode portion and the upper surface of the resin layer form a continuous curved surface, and the substrates are heated to a predetermined temperature and bonded.

In the method of manufacturing a semiconductor device of the present invention, an activation process may be performed on the surfaces of the electrode portions before the wiring substrates are bonded.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The present invention will be now described herein with reference to illustrative preferred embodiments. Those skilled in the art will recognize that many alternative preferred embodiments can be accomplished using the teaching of the present invention and that the present invention is not limited to the preferred embodiments illustrated for explanatory purpose.

A first preferred embodiment of the present invention will be described with reference to FIGS. 1 to 10.

Figure 1:
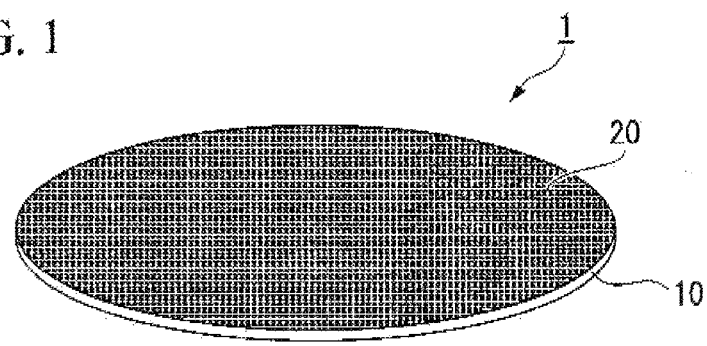
FIG. 1 is a perspective view illustrating a wiring substrate in accordance with a first preferred embodiment of the present invention.

FIG. 1 is a perspective view illustrating a wiring substrate 1 in accordance with the first preferred embodiment of the present invention. The wiring substrate 1 includes a plate- or sheet-shaped base 10 and a plurality of electrode portions 20 formed on a surface of the base 10.

The base 10 is formed of an insulator or a semiconductor in a plate or sheet shape having a predetermined thickness. An example of the insulator and the semiconductor forming the base 10 may include silicon, resin, ceramics, and glass. In the present preferred embodiment, a silicon wafer is used as the base 10.

Further, although not shown, a wiring electrically connected to the electrode portions 20 is formed in the base 10. An aspect of the wiring may be formed in one surface or both surfaces in a thickness direction of the base 10 by printing, etching or the like, may be formed to penetrate the base like a via, may be a three-dimensional wiring using stacking technology, or may be an appropriate combination thereof.

Figure 2:
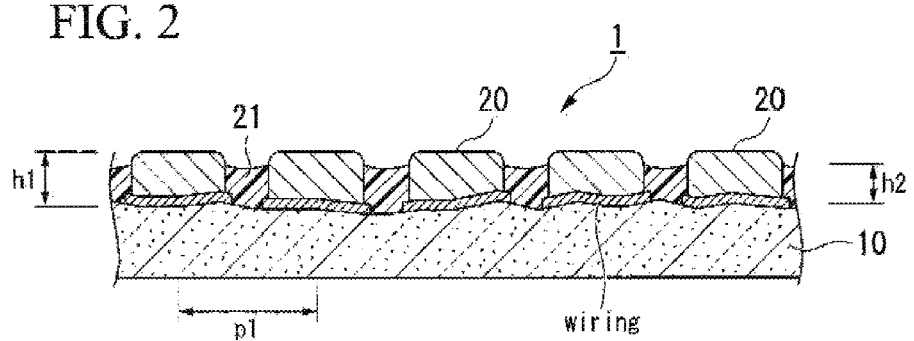
FIG. 2 is an enlarged cross-sectional view illustrating the electrode portions and the vicinity thereof of the wiring substrate in accordance with the first preferred embodiment of the present invention.

FIG. 2 is an enlarged cross-sectional view illustrating the electrode portions and the vicinity thereof of the wiring substrate in accordance with the first preferred embodiment of the present invention. Each of the electrode portions 20 is formed to protrude on the surface of the base 10 as so-called bumps formed in a substantially cylindrical shape.

Each electrode portion 20 is formed of a conductive material such as a metal. An example of the metal forming the electrode portion 20 may include gold, copper, nickel, and an alloy containing at least one of these metals.

A resin layer 21 is formed of an insulating resin between the respective electrode portions 20. That is, in a predetermined region on the surface of the base 10, the plurality of electrode portions 20 electrically connected to the wiring protrude and the resin layer 21 is arranged to fill a gap between the electrode portions 20.

Figure 3:
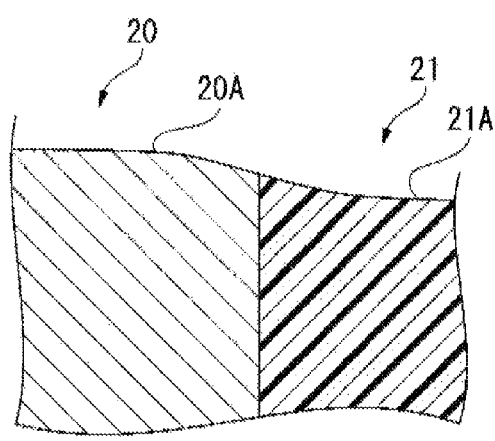
FIG. 3 is a cross-sectional view illustrating the electrode portion and the resin layer, which have been further enlarged, in accordance with the first preferred embodiment of the present invention.

FIG. 3 is a cross-sectional view illustrating the electrode portion and the resin layer, which have been further enlarged, in accordance with the first preferred embodiment of the present invention. As illustrated in FIG. 3, the resin layer 21 has an upper surface 21A formed in a gradual concave shape and formed lower than a maximum height h1 (see FIG. 2) of the electrode portion 20. Further, an upper surface 20A of the electrode portion 20 and the upper surface 21A of the resin layer 21 are smoothly connected to form a continuous curved surface. In the present invention, the "continuous curved surface" means a surface having no step. That is, in the continuous curved surface, an outer peripheral surface of the substantially cylindrical electrode portion 20 is not exposed at a boundary between the upper surface 20A and the upper surface 21A.

A minimum height h2 of the resin layer 21 illustrated in FIG. 2 may be appropriately set in consideration of an amount of expansion of the resin layer due to heating at the time of bonding, a formation pitch p1 or the maximum height h1 of the electrode portion 20, or the like. It is desirable for an estimated maximum height at the time of expansion of the resin layer to be set to be substantially the same as h1.

An example of a method of manufacturing the wiring substrate 1 configured as described above will be described. FIGS. 4 to 7 are views illustrating a process in an example of the method of manufacturing a wiring substrate in accordance with the first preferred embodiment of the present invention.

Figure 4:
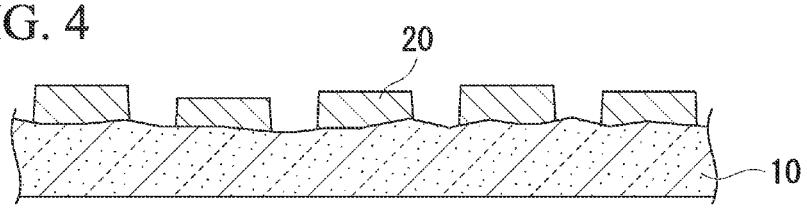
FIG. 4 is a view illustrating a process in an example of a method of manufacturing the wiring substrate in accordance with a first preferred embodiment of the present invention.

First, a resist layer is formed on a base 10 and a plurality of openings according to a pattern for forming the electrode portion are formed in the resist layer. Next, if each opening is filled with a conductive material, for example, by plating and the resist layer is removed, a plurality of electrode portions 20 are formed on the base 10, as illustrated in FIG. 4.

Next, a resin is applied to the surface of the base 10 on which the electrode portions 20 have been formed, to thereby form a resin layer 21 that fills between the electrode portions 20. A resin material for forming the resin layer 21 is not particularly limited and, for example, an insulating resin such as polyimide, a semi-cured resin that is usually injected after wafer bonding, or a photosensitive resin as described in Patent Document 1 may be used.

Figure 5:
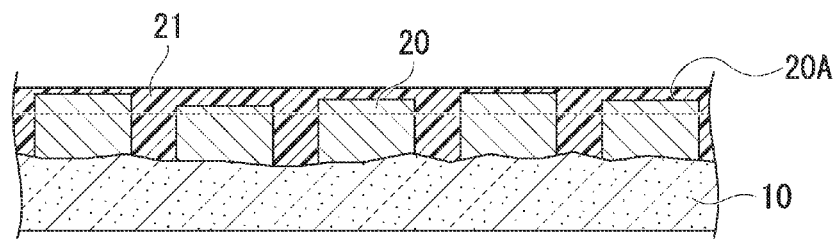
FIG. 5 is a view illustrating a process in an example of a method of manufacturing the wiring substrate in accordance with a first preferred embodiment of the present invention.
Figure 6:
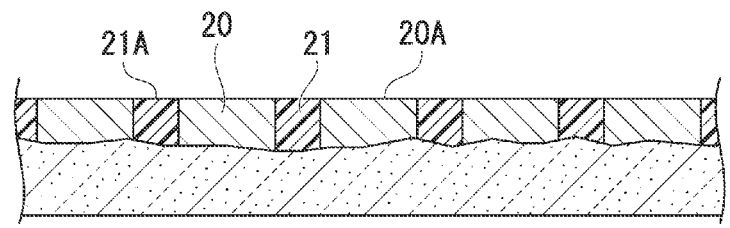
FIG. 6 is a view illustrating a process in an example of a method of manufacturing the wiring substrate in accordance with a first preferred embodiment of the present invention.

Since the resin layer 21 immediately after being formed covers all or a part of the upper surface of the electrode portion 20 as illustrated in FIG. 5, a planarization process is performed on the electrode portion 20 and the resin layer 21 to expose the upper surface 20A of the electrode portion 20. A method of the planarization process is not particularly limited and chemical mechanical polishing (CMP), cutting, grinding or the like may be used. Through this planarization process, the upper surface 20A and the upper surface 21A of the resin layer 21 are smoothly connected to be a substantially continuous flat surface, as illustrated in FIG. 6.

Next, upper-surface processing is performed on the electrode portion 20 and the resin layer 21 by etching. However, the upper-surface processing is performed while adjusting an etching condition so that the resin layer 21 is eroded more than the electrode portion 20. Be careful since excessive etching exposes the outer peripheral surface of the electrode portion 20 in the substantially cylindrical shape, generating a step.

Figure 7:
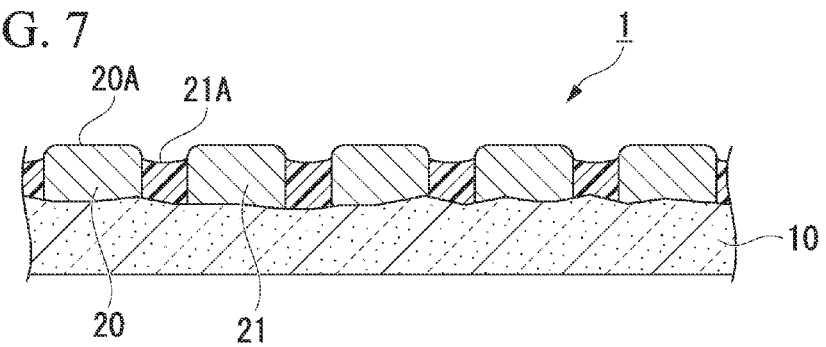
FIG. 7 is a view illustrating a process in an example of a method of manufacturing the wiring substrate in accordance with a first preferred embodiment of the present invention.

When the upper-surface processing is performed keeping the above-described point in mind, a predetermined amount of the resin layer 21 is removed by etching. As a result, the upper surface 21A of the resin layer 21 is processed to form a continuous curved surface with the upper surface 20A of the electrode portion 20 as illustrated in FIG. 7, thus completing the wiring substrate 1.

Figure 8:
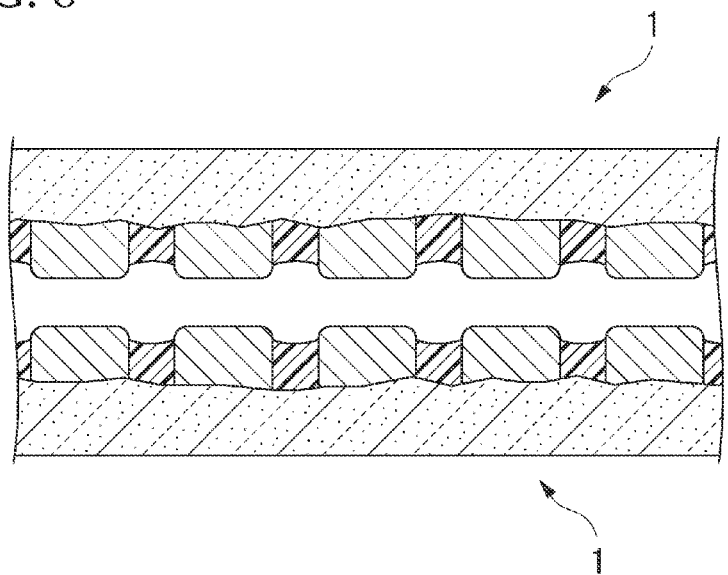
FIG. 8 is a view illustrating a process of a method of manufacturing a semiconductor device by bonding the wiring substrates in accordance with the first preferred embodiment of the present invention.
Figure 9:
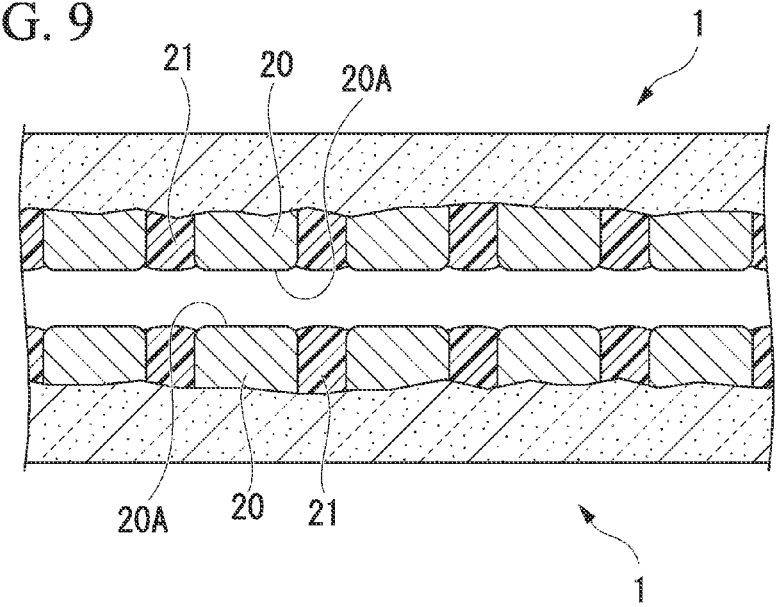
FIG. 9 is a view illustrating a process of a method of manufacturing a semiconductor device by bonding the wiring substrates in accordance with the first preferred embodiment of the present invention.
Figure 10:
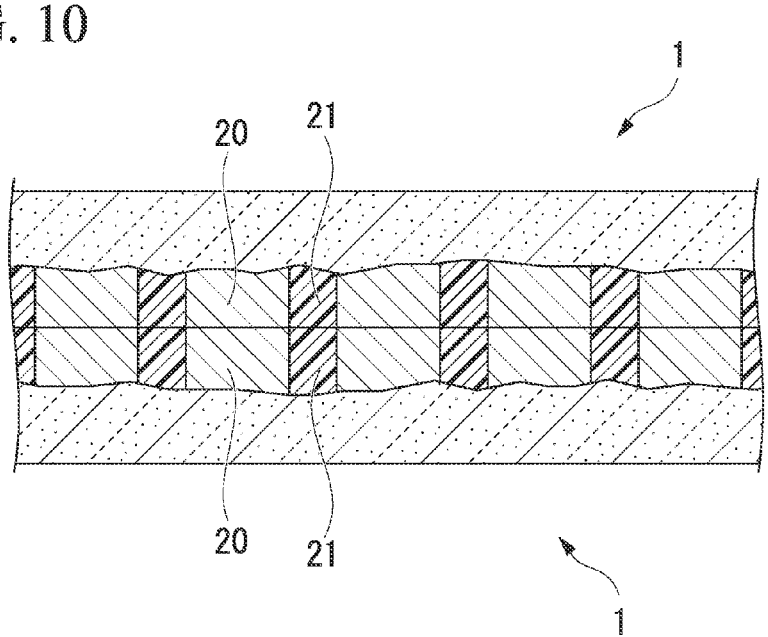
FIG. 10 is a view illustrating a process of a method of manufacturing a semiconductor device by bonding the wiring substrates in accordance with the first preferred embodiment of the present invention.

If the wiring substrates 1 of the present preferred embodiment are integrally bonded, with the surfaces of the wiring substrates having the electrode portions 20 formed therein opposed to each other and the electrode portions of the wiring substrates aligned, the electrode portions are electrically bonded, thereby forming a semiconductor device. Hereinafter, an operation and effects of the wiring substrates 1 at the time of bonding described above will be described with reference to FIGS. 8 to 10. FIGS. 8 to 10 are views illustrating a process of a method of manufacturing a semiconductor device by bonding the wiring substrates in accordance with the first preferred embodiment of the present invention.

First, as illustrated in FIG. 8, the wiring substrates 1 are opposed to each other in a state in which the wiring substrates 1 are positioned. For example, a known wafer bonding apparatus may be used for positioning. Further, the surface of the base 10 and the electrode portions 20 of each wiring substrate 1 may be cleaned by plasma cleaning, reverse sputtering, or the like prior to bonding. Since this process is a process of activating the surfaces of the electrode portions, the electrode portions can be bonded by so-called surface activation.

Next, if each wiring substrate 1 is pressurized while being heated, the opposing electrode portions 20 approach each other as illustrated in FIG. 9. In this case, the resin layer 21 is expanded due to heating, which increases the height of the resin layer 21. However, since the resin layer 21 is formed lower than the electrode portion 20 prior to bonding as described above, the resin layer 21 does not protrude higher than the upper surface 20A of the electrode portion 20, and does not protrude on the upper surface 20A.

Further, if each wiring substrate 1 is pressurized, the opposing electrode portions 20 are bonded and electrically connected, as illustrated in FIG. 10. Since the resin layer 21 does not protrude on the upper surface 20A as described above, each electrode portion 20 is reliably connected. Further, the resin layer 21 is appropriately expanded to such an extent as to fill the gap between the electrode portions substantially with no gap, thus suitably protecting a bonding state of the electrode portions. If the two wiring substrates 1 are divided in division units by dicing or the like as necessary after being bonded, a semiconductor device using the wiring substrates 1 is completed.

As described above, according to the wiring substrate 1 of the first preferred embodiment of the present invention, since the resin layer 21 is formed between the plurality of electrode portions 20, the bonded electrode portions 20 are suitably protected even without performing resin injection after direct wafer bonding. Further, since the upper surface of the resin layer 21 is formed in a concave shape lower than the maximum height of the electrode portion 20, the resin layer 21 does not interfere with bonding between the electrode portions even when the resin layer 21 is expanded due to the wiring substrates being heated at the time of bonding. Accordingly, even in use for direct wafer bonding, the electrode portions can be bonded with high reliability.

Further, since the upper surface 20A of the electrode portion 20 and the upper surface 21A of the resin layer 21 form the continuous curved surface, the height of the resin layer expanded due to heating is substantially the same as the maximum height of the expanded electrode portion 20, and the resin layer is arranged substantially just enough in the gap between the electrode portions after bonding. Accordingly, a part in which the upper surfaces of the electrode portions are in contact and electrically connected, and the vicinity thereof can be suitably protected by the resin layer, unlike a case in which the resin layer is simply formed lower than the electrode portion.

Further, according to the method of manufacturing the wiring substrate 1 in the first preferred embodiment of the present invention, the planarization process is performed so that the upper surface 21A of the resin layer 21 formed to fill between the plurality of electrode portions 20 and the upper surface 20A of the electrode portion is substantially flat and then the upper-surface processing is performed on the upper surfaces of the electrode portions and the resin layer so that the resin layer is carved more than the electrode portion. Thus, the "continuous surface" can be easily formed.

While the example in which the resin layer is formed by applying a resin after removing the resist layer used for formation of the electrode portions has been described above, the resist layer may be directly used as the resin layer, unlike such an example.

Further, the method of upper-surface processing for the electrode portions and the resin layer after the planarization process is not limited to the above-described etching. For example, the resin layer having the upper surface forming the continuous curved surface with the upper surface of the electrode portion may also be formed by forming the resin layer of a semi-cured resin and partially removing only the resin layer by squeegee in a state in which a difference in rigidity between the resin layer and the electrode portion becomes great.

The electrode portions and the resin layer may be formed on both surfaces in the thickness direction of the base. A wiring substrate of the present invention in which the electrode portions are formed on both surfaces may also be used as a so-called interposer.

A semiconductor element, a semiconductor chip having a semiconductor element formed therein, a semiconductor package having a semiconductor chip embedded therein, or the like is mounted on or embedded in the wiring substrate of the present invention. In this case, the wiring substrate of the present invention may function as a semiconductor device in a state before bonding.

Types of the wiring substrate and the semiconductor device constituting a semiconductor device by itself or by bonding in the present invention are not particularly limited but, for example, in a solid-state imaging device having a number of pixels, a larger number of electrodes need to be formed at a small pitch (e.g., 10 μm or less), and accordingly, great merits are obtained by applying the present invention and it is very suitable to apply the structure of the present invention.

According to the wiring substrate and the semiconductor device in accordance with the preferred embodiment of the present invention, bonded electrodes can be suitably protected even without injecting a resin after bonding.

According to the method of manufacturing a wiring substrate in accordance with the preferred embodiment of the present invention, the resin layer forming the continuous curved surface with the upper surface of the electrode portion can be easily formed.

According to the method of manufacturing a semiconductor device in accordance with the preferred embodiment of the present invention, the electrode portions can be reliably bonded while suitably protecting the electrode portions with a resin.

As used herein, the following directional terms "forward, rearward, above, downward, right, left, vertical, horizontal, below, transverse, row and column" as well as any other similar directional terms refer to those directions of an apparatus equipped with the present invention. Accordingly, these terms, as utilized to describe the present invention should be interpreted relative to an apparatus equipped with the present invention.

The term "configured" is used to describe a component, unit or part of a device includes hardware and/or software that is constructed and/or programmed to carry out the desired function.

While preferred embodiments of the present invention have been described and illustrated above, it should be understood that these are examples of the present invention and are not to be considered as limiting. Additions, omissions, substitutions, and other modifications can be made without departing from the scope of the present invention. Accordingly, the present invention is not to be considered as being limited by the foregoing description, and is only limited by the scope of the claims.

What is claimed is:

1. A method of manufacturing a wiring substrate including a base having a predetermined thickness, a plurality of electrode portions formed to protrude on one surface in a thickness direction of the base, and a wiring provided in the base and electrically connected to the electrode portions, the method comprising:
    forming the plurality of electrode portions on one surface of the base;
    forming a resin layer on the base to fill between the plurality of electrode portions;
    performing a planarization process on upper surfaces of the electrode portions and the resin layer to expose the upper surfaces of the electrode portions; and
    performing upper-surface processing on the upper surfaces of the electrode portions and the resin layer after the planarization process, so that the resin layer is more removed than the electrode portions, and wherein
    the resin layer comprises a first material having a first direction of thermal expansion in the direction of the thickness,
    the plurality of electrode portions comprises a second material having a second direction of thermal expansion in the direction of the thickness,
    the thermal expansion in the first direction is greater than the thermal expansion in the second direction, and a first thickness of the resin layer becomes a second thickness of the plurality of electrode portions, when the resin layer and the plurality of electrode portions are heated to a predetermined temperature.

2. The method of manufacturing a wiring substrate according to claim 1, wherein the planarization process is chemical mechanical polishing.

3. A method of manufacturing a semiconductor device formed by bonding at least two wiring substrates having electrode portions formed therein, wherein at least one of the wiring substrates is a wiring substrate including:
    a base having a predetermined thickness;
    a plurality of electrode portions formed to protrude on one surface in a thickness direction of the base;
    a wiring provided in the base and electrically connected to the electrode portions; and
    a resin layer formed on the base to fill between the plurality of electrode portions, and wherein
    an upper surface of the resin layer is formed in a concave shape lower than a maximum height of the electrode portion, and an upper surface of the electrode portion and the upper surface of the resin layer form a continuous curved surface,
    the resin layer comprises a first material having a first direction of thermal expansion in the direction of the thickness,
    the plurality of electrode portions comprises a second material having a second direction of thermal expansion in the direction of the thickness,
    the thermal expansion in the first direction is greater than the thermal expansion in the second direction,
    the substrates are heated to a predetermined temperature and bonded, and
    a first thickness of the resin layer becomes a second thickness of the plurality of electrode portions, when the resin layer and the plurality of electrode portions are heated to the predetermined temperature.

4. The method of manufacturing a semiconductor device according to claim 3, wherein an activation process is performed on the surfaces of the electrode portions before the wiring substrates are bonded.

5. A method of manufacturing a semiconductor device formed by bonding at least two wiring substrates having electrode portions formed therein, wherein at least one of the wiring substrates is a wiring substrate in a semiconductor device including:
    a wiring substrate including
    a base having a predetermined thickness;
    a plurality of electrode portions formed to protrude on one surface in a thickness direction of the base;
    a wiring provided in the base and electrically connected to the electrode portions; and
    a resin layer formed on the base to fill between the plurality of electrode portions, wherein an upper surface of the resin layer is formed in a concave shape lower than a maximum height of the electrode portion, and an upper surface of the electrode portion and the upper surface of the resin layer form a continuous curved surface; and
    a semiconductor element provided in the base, and wherein
    the resin layer comprises a first material having a first direction of thermal expansion in the direction of the thickness,
    the plurality of electrode portions comprises a second material having a second direction of thermal expansion in the direction of the thickness,
    the thermal expansion in the first direction is greater than the thermal expansion in the second direction,
    the substrates are heated to a predetermined temperature and bonded, and
    a first thickness of the resin layer becomes a second thickness of the plurality of electrode portions, when the resin layer and the plurality of electrode portions are heated to the predetermined temperature.

6. The method of manufacturing a semiconductor device according to claim 5, wherein an activation process is performed on the surfaces of the electrode portions before the wiring substrates are bonded.

* * * * *